United States Patent [19]
Oda

[11] Patent Number: 5,479,053
[45] Date of Patent: Dec. 26, 1995

[54] SEMICONDUCTOR DEVICE WITH CONDUCTOR CLAD INSULATOR WIRING

[75] Inventor: Noriaki Oda, Tokyo, Japan

[73] Assignee: NEC Corporation, Japan

[21] Appl. No.: 65,629

[22] Filed: May 21, 1993

[30] Foreign Application Priority Data

May 22, 1992 [JP] Japan ..................... 4-130349

[51] Int. Cl.$^6$ ................................... H01L 23/48
[52] U.S. Cl. ..................... 257/750; 257/764; 257/769; 257/773
[58] Field of Search ................... 257/773, 750, 257/751, 764, 769, 763; 29/828

[56] References Cited

U.S. PATENT DOCUMENTS

| | | | |
|---|---|---|---|
| 3,988,764 | 10/1976 | Cline et al. | 257/531 |
| 4,581,291 | 4/1986 | Bongianni | 428/381 |
| 4,776,087 | 10/1988 | Cronin et al. | 29/828 |
| 4,833,519 | 5/1989 | Kawano et al. | 257/752 |

FOREIGN PATENT DOCUMENTS 3165037  7/1991  Japan .

OTHER PUBLICATIONS

"A Submicron Triple Level Metallization Process For High Performance Application Specific Circuits", D. Pramanik et al., Jun. 1992, VMIC Conference.

Primary Examiner—William Mintel
Assistant Examiner—Roy Potter
Attorney, Agent, or Firm—Laff, Whitesel, Conte & Saret, Ltd.

[57] ABSTRACT

A semiconductor device which comprises a first insulator, a first conductor disposed on one side near a semiconductor substrate, a second conductor disposed on the opposite side to the substrate forming a tubular member together with the first conductor, and a second insulator surrounding the member. The first insulator is incorporated into the member, and the member and the first insulator constitute an electrical wiring. Since the wiring is composed of the first insulator and the first and second conductors surrounding the first insulator, an electric current flows through the tubular member of the conductors. Therefore, when the device is operated by a high-frequency (for example 80 GHz or more) electric current, apparent increase of the wiring resistance due to the "skin effect" hardly occurs and as a result, reduction of the operating speed can be prevented.

7 Claims, 6 Drawing Sheets 5,479,053

SEMICONDUCTOR DEVICE WITH CONDUCTOR CLAD INSULATOR WIRING

BACKGROUND OF THE INVENTION

1. Field of the Invention

The present invention relates to a semiconductor device and more particularly, to a semiconductor device having improved wirings through which a high-frequency electric current flows.

2. Description of the Related Art

FIG. 1 shows a conventional semiconductor device having two-layer wirings.

In FIG. 1, $N^+$-diffusion layer 202 is formed in a surface area of a P-silicon substrate 201 and a insulator film 203 is formed on the surface of the substrate. The insulator film 203 has a contact hole 204 at a position corresponding to the diffusion layer 202.

A silicon dioxide film obtained by the Chemical Vapor Deposition (CVD) or the Plasma-Enhanced CVD technique is generally used as the insulator film 203.

There is provided on the insulator film 203 with a first interlayer insulator film 206 in which first wirings are disposed, and a second interlayer insulator film (not shown) is formed on the film 206. The film 206 has first openings 224a and 224b in which the first wirings are arranged respectively. The opening 224a communicates with the contact hole 204 of the insulator film 203 so that the first wiring in the opening 224a is electrically connected to the $N^+$-diffusion layer 202 disposed thereunder. The film 206 also has a through hole 214 communicating with the first opening 224b so that the first wiring in the opening 224b is electrically connected to a second wirings disposed thereon. The openings 224a and 224b each has a depth nearly equal to half the thickness of the first interlayer insulator film 206.

In FIG. 1, the first wirings arranged in the respective openings 224a and 224b extend parallel to each other and perpendicular to the second wiring.

As the first interlayer insulator film 206 and the second interlayer insulator film, inorganic insulator films such as a silicon dioxide film which are obtained by the Plasma-Enhanced CVD technique, organic or inorganic insulator films obtained by application, and complex or combination films composed of these films.

The first wirings are respectively composed of three films, or a titanium/tungsten alloy film 205a, a platinum film 215 and a gold film 207. The gold film 207 act as a main component of each first wiring.

The second wiring is composed of two films, or a titanium/tungsten alloy film 205b and a gold film 217. The gold film 217 act as a main component of the second wiring. The first wiring in the opening 224a is electrically connected to the $N^+$-diffusion layer 202 in the substrate 201, and the first wiring in the opening 224b is electrically connected to the second wiring.

An aluminum or aluminum alloy film may be used instead of the gold film 207 and/or the gold film 217.

In the opening 224a, the titanium/tungsten alloy film 205a is contacted with the side face of the insulator film 203 and the surface of the diffusion layer 202 in the contact hole 204.

In the opening 224b, the titanium/tungsten alloy film 205a is contacted with the surface of the insulator film 203 and the top face of the gold film 207 is contacted with the bottom face of the titanium/tungsten alloy film 205b.

The surface of the second interlayer insulator film is covered with a passivation layer 213, which is generally composed of an organic insulator film obtained by application such as polyimide or the like.

In the case of first, second and third wirings being formed, there is provided in the second interlayer insulator film with a through hole similar to the through hole 214, through which the second wiring is electrically connected to the third wiring formed on the second interlayer insulator film. In the case of fourth wiring or more being formed additionally, a through hole or holes are provided and the electrical connection or connections are done similarly.

With the conventional semiconductor device, when it is operated by a high-frequency electric current, for example 80 GHz, most of the current flows in the peripheries of the gold films 207 and 217 of the first and second wirings due to the "skin effect", so that there is a problem that the operating speed is reduced since electric current densities in the centers of the gold films 207 and 217 become very small and apparent cross sectional areas thereof are reduced to increase their wiring resistances.

SUMMARY OF THE INVENTION

Accordingly, it is an object of the present invention to provide a semiconductor device in which the operating speed is not reduced even when a high-frequency electric current is supplied.

A semiconductor device of the present invention has a wiring which is composed of an insulator and a conductor formed so as to surround the insulator.

As the insulator, for example, polyimide, oxide obtained from 03/TEOS (tetraethoxyoxisillane) or the like may be used.

As the conductor, for example, gold, aluminum, aluminum alloy or the like may be used.

In a preferred embodiment, the conductor is composed of electroconductive layers and its innermost layer contacting the insulator is gold. In the case, the outermost layer, which is contacted with an insulator surrounding the wirings, of the electroconductive layers is a metal film containing titanium.

The titanium-containing metal includes titanium, titanium/tungsten alloy, titanium nitride or the like.

With the semiconductor device of the present invention, the wiring is composed of the insulator and the conductor formed so as to surround the insulator, so that when the device is operated by a high-frequency electric current such as 80 GHz one, apparent increase of the wiring resistance due to the "skin effect" hardly occur and as a result, reduction of the operating speed can be prevented.

DETAILED DESCRIPTION OF THE PREFERRED EMBODIMENT

Preferred embodiments of the present invention will be described below referring to FIGS. 2 and 3A to 3E attached.

[First Embodiment]

Figure 1:
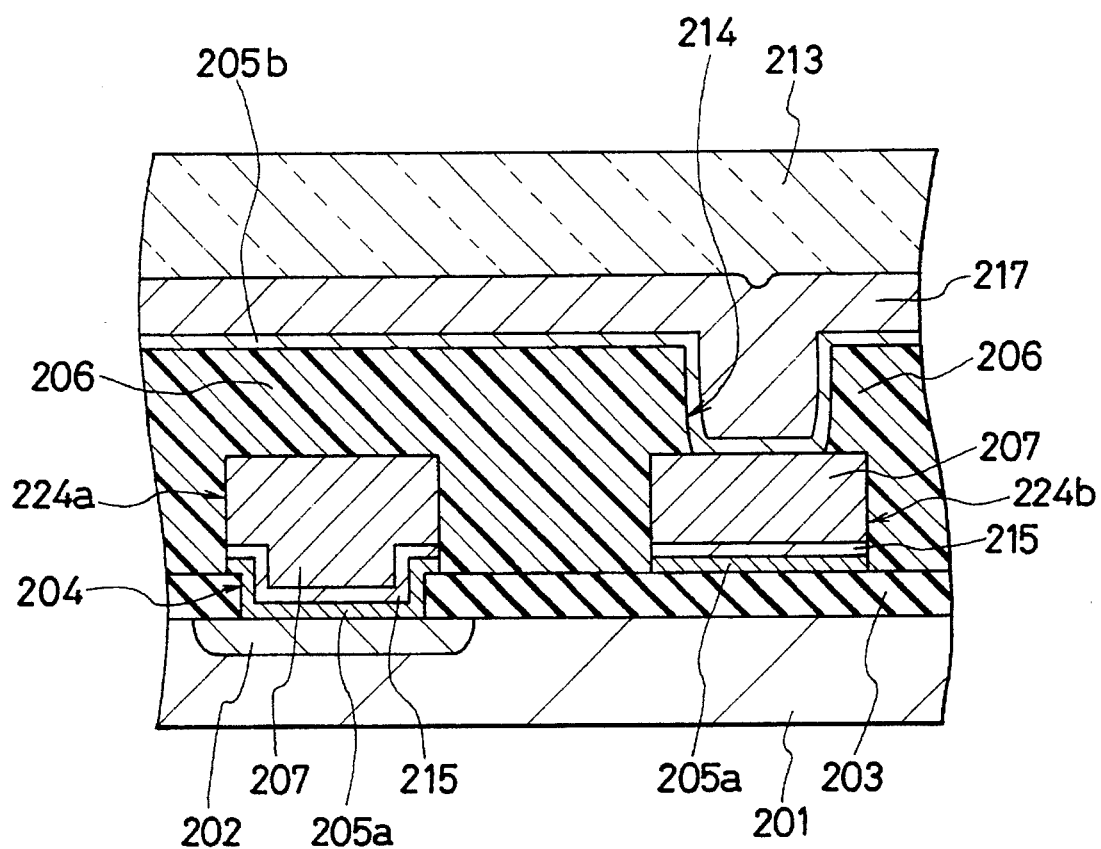
FIG. 1 is a partial cross section of a conventional semiconductor device.
Figure 2:
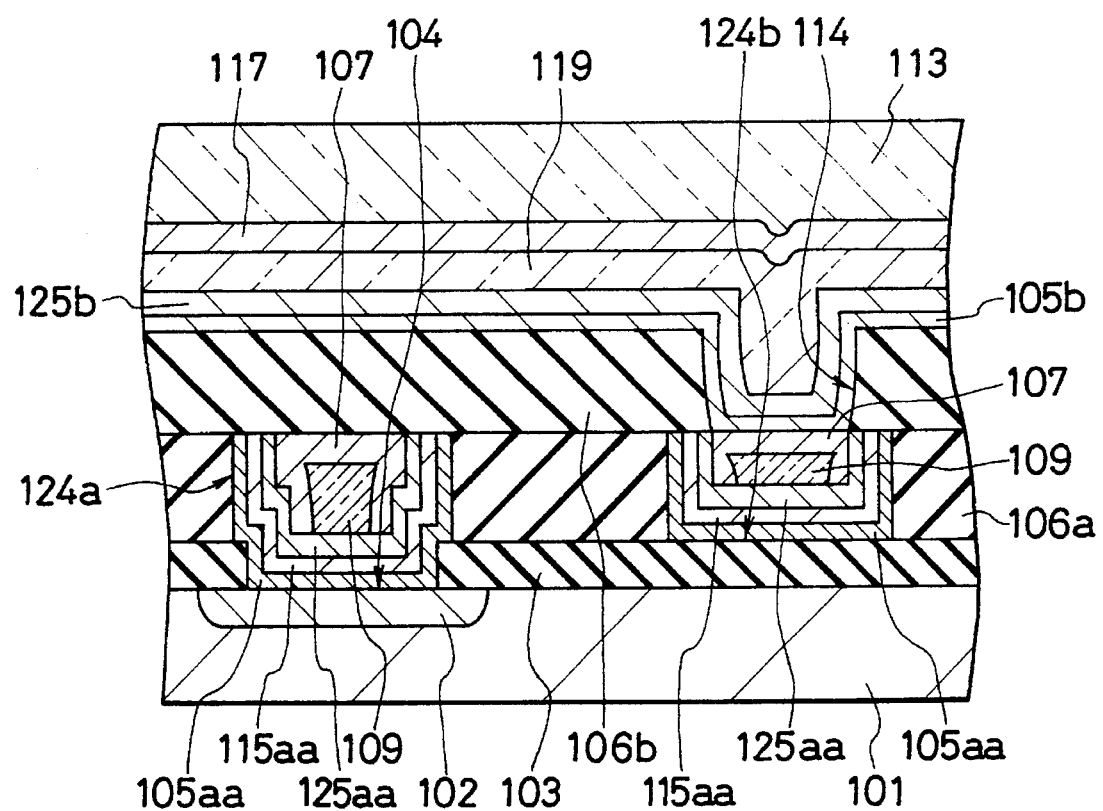
FIG. 2 is a partial cross section of a semiconductor device according to a first embodiment of the present invention.

In FIG. 2, on a surface of a P-silicon substrate 101 having a $P^+$-diffusion layer 102 therein, an insulator film 103 made of silicon dioxide is formed. The insulator film 103 has a contact hole 104 formed at a position corresponding to the diffusion layer 102. There is provided on the insulator film 103 with a first interlayer insulator film 106a made of silicon nitride, which has first openings 124a and 124b.

In the first openings 124a and 124b, the first wirings are arranged respectively. Each of the first wirings is composed of an insulator 109 of a polyimide film as a core thereof and a conductor made of four electroconductive films stacked as a clad thereof. The electroconductive films are a titanium/tungsten alloy film 105aa, a platinum film 115aa, and gold films 125aa and 107. The gold film 107 acts as a main component of each first wiring. The titanium/tungsten alloy film 105aa serves to give better adherence between the first wiring and the insulator film 103.

The platinum film 115aa act as a barrier by which gold atoms in the gold films 107 and 125aa are prevented from diffusing into the $N^+$-diffusion layer 102 to generate some defects such as destruction of the P-N junction under heat treatment.

The titanium/tungsten alloy film 105aa, platinum film 115aa and gold film 125aa have cross sections bent like a U character and the gold film 107 has a cross section bent like an inverse U character. The insulator 109 has a cross section like a rectangle. The bottom face of the insulator 109 is contacted in its central portion with the gold film 125aa and the remainder of the central portion is contacted with the gold film 107. Thus, the entirety of the insulators 109 are respectively surrounded by the gold films 107 and 125aa.

In the first opening 124a, the titanium/tungsten alloy film 105aa is contacted with the side face of the insulator film 103 and the surface of the N+-diffusion layer 102 in the contact hole 104, and is contacted with the side face of the first interlayer insulator film 106a. The top ends of the titanium/tungsten alloy film 105aa, the platinum film 115aa and the gold films 107 and 125aa are contacted with the bottom face of the second interlayer insulator film 106b formed on the first interlayer insulator film 106a.

In the first opening 124b, the titanium/tungsten alloy film 105aa is contacted with the surface of the insulator film 103 and the side face of the second interlayer insulator film 106a. The top ends of the titanium/tungsten alloy film 105aa, the platinum film 115aa and the gold film 125aa are contacted with the bottom face of the second interlayer insulator film 106b formed on the first interlayer insulator film 106a. The top face of the gold film 107 is contacted with the titanium/tungsten alloy film 105b constituting the second wiring.

The second interlayer insulator film 106b made of silicon dioxide has a through hole 114 for electrically connecting to the first wiring in the opening 124b.

On the second interlayer insulator film 106b, there is provided with a third interlayer insulator film made of silicon nitride having a second opening, in which the second wiring is arranged. In the second opening, the second wiring is arranged, each of which is composed of an insulator 119 of a polyimide film as a core thereof and a conductor made of three electroconductive films stacked as a clad thereof. The electroconductive films are a titanium/tungsten alloy film 105b and gold films 125b and 117. The gold film 117 acts as a main component of the second wiring. The second wiring has the same cross section as that of the first wiring in the first opening 124b except for not having a platinum film.

The titanium/tungsten alloy film 105b is contacted with the side face of the second interlayer insulator film 106b and the bottom face of the gold film 107 of the first wiring in the through hole 114, and is contacted with a bottom face of a third interlayer insulator film and the side face of the second interlayer insulator film 106b in the second opening.

The titanium/tungsten alloy film 105b serves to give better adherence between the second wiring and the second interlayer insulator film 106b.

There is provided with an insulator film 113 for passivation on the third interlayer insulator film. The top faces of the gold films 117 and 125b and the titanium/tungsten alloy film 105b are contacted with the passivation film 113.

The film 113 may be formed by a film such as a silicon nitride film, silicon oxide film or polyimide film, or complex or combination films made of these films.

Next, the fabrication method of the semiconductor device is described below referring to FIGS. 3A to 3E.

First, after selectively forming the $N^+$-diffusion layer 102 in the surface area in the P-silicon substrate 101, a silicon dioxide film as the insulator film 103 is formed on the surface of the substrate 101 by the CVD or Plasma-Enhances CVD technique. On the insulator film 103, a silicon nitride film is formed by the Plasma-Enhances CVD technique and a photoresist film is formed on the entire surface of the silicon nitride film and patterned. Thereafter, the silicon nitride film is etched back to obtain the first interlayer insulator film 106a having a flat surface as shown in FIG. 3A by an ordinary method.

Next, the first interlayer insulator film 106a is selectively removed to form the first openings 124a and 124b in which the first wirings are arranged respectively by the photolithography and dry or wet etching techniques. The insulator 103 is selectively removed in the opening 124a to form the contact hole 104 by the photolithography and dry or wet etching techniques. The state of this time is shown in FIG. 3A.

Figure 3A:
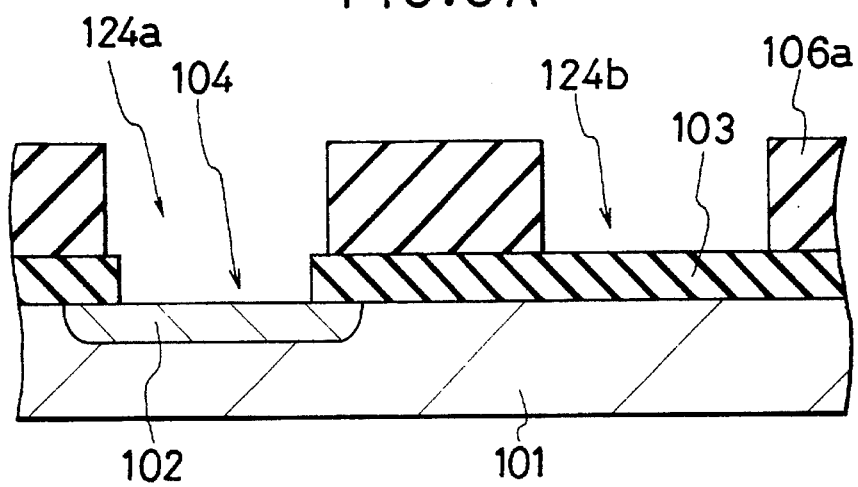
FIGS. 3A to 3E are partial cross sections respectively showing fabrication processes of the semiconductor device of the first embodiment.

The titanium/tungsten alloy film 105a, the platinum film 115a and the gold film 125a are successively formed on the entire surface of the substrate shown in the FIG. 3A by the sputtering technique. At this time, the total thickness of the films 105a, 115a and 125a is larger than that of the insulator film 103.

Figure 3B:
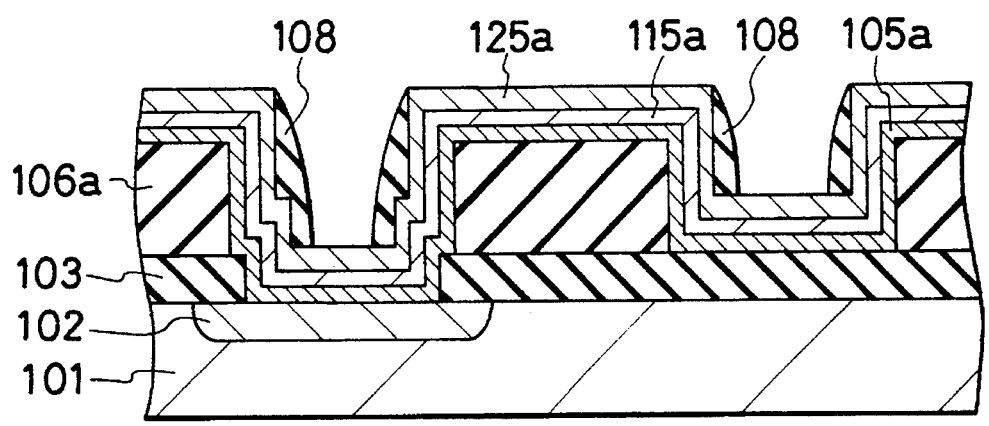

A silicon dioxide film is formed on the entire surface of the gold film 125a by the Plasma-Enhanced CVD technique and then, the silicon dioxide film is etched back to leave it only on the gold film 125a in the openings 124a and 124b by the Reactive Ion Etching (RIE) technique. Thus, side wall spacers made of the silicon dioxide film are formed in the openings 124a and 124b respectively, as shown in FIG. 3B.

Figure 3C:
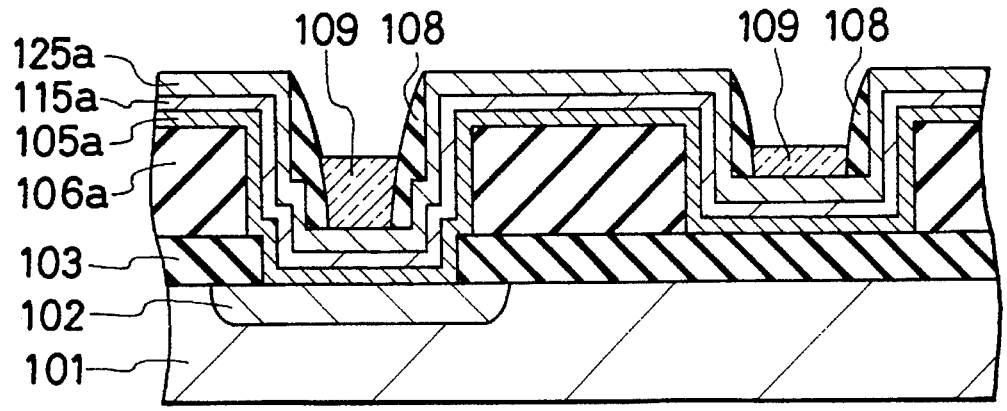

Next, liquid polyimide is applied on the gold film 125a by the spin coating method and the polyimide film thus obtained is heat-treated. Then, the polyimide film is etched back to leave it inside of the sidewall spacers 108 by the RIE technique using oxygen. Thus, the insulator 109 made of polyimide is respectively formed in the openings 124a and 124b as shown in FIG. 3C.

In the process, it is required that the height of the top face of the insulator 109 is lower than that of the first interlayer insulator film 106a. Since liquid polyimide is easy to go into a narrow space, it is preferable as a material for the insulator 109.

Figure 3D:
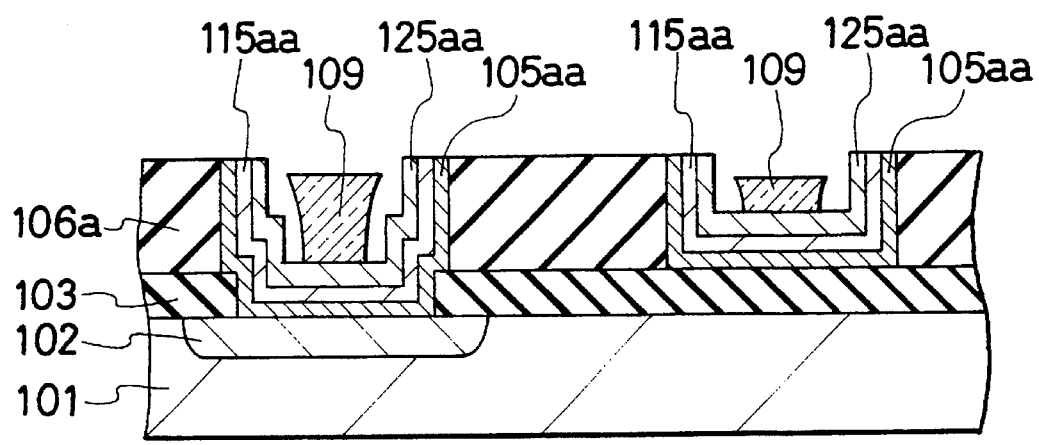

The gold film 125a, the platinum film 115a and the titanium/tungsten alloy film 105a are etched back to be removed till the first interlayer insulator film 106a is exposed by the ion milling technique and then, the films 125aa, 115aa and 105aa are selectively left as shown in FIG. 3D. Subsequently, the sidewall spacers 108 made of silicon dioxide are selectively removed by the wet etching technique using a buffered solution of hydrofluoric acid.

Figure 3E:
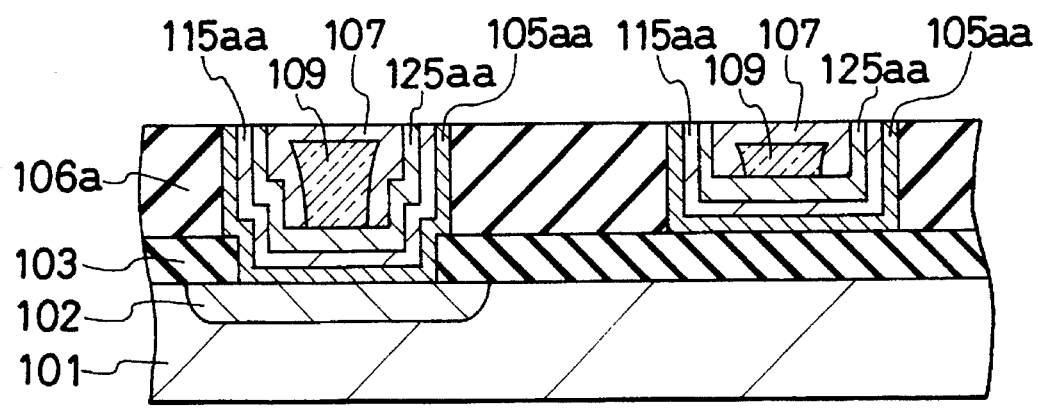

Next, a gold film (not shown), which is issued an as electrode for the electric plating in the next process, is formed on the surface of the first interlayer insulator film 106a and exposed surfaces therefrom by the sputtering technique. Then, a gold film is formed on the entire surface of the electrode by the electric plating technique using the electrode and thereafter, the gold film is etched back by the ion milling technique till the surface of the first interlayer insulator film 106a is exposed. Thus, the gold films 107 which are buried in the openings 124a and 124b respectively are obtained as shown in FIG. 3E, and the processes of forming the first wirings are finished.

The second wiring is formed by the same way as those of the first wirings. That is, as shown in FIG. 3E, a silicon dioxide film having a flat surface as the second interlayer insulator film 106b is formed on the first interlayer insulator film 106a in which the first wirings are arranged, and the through hole 114 is formed therein.

Next, a silicon nitride film having a flat surface as the third interlayer insulator film is formed on the second interlayer insulator film 106b, and the second opening is formed therein. After the titanium/tungsten alloy film 105b and the gold film 125b as the clad of the second wiring are formed sequentially on the third interlayer insulator film, the insulator film 119 made of polyimide as the core of the second wiring is formed thereon.

Subsequently, the gold film 117 as the clad of the second wiring is formed so as to surround the insulator film 119. Thus, the second wiring are arranged.

Finally, the insulator film 113 for passivation is formed to cover the entire surface of the third interlayer insulator film. Thus, the semiconductor device shown in FIG. 2 is obtained.

As described above, with the device of the first embodiment, each of the first and second wirings has such a structure that the conductor clad is disposed so as to surround the insulator core, so that an entire electric current flows through the conductor clad, and almost all of the current is flows through the gold layer 107 or 117. Thus, when the semiconductor device is driven by a high-frequency current such as a 80 GHz one, increase of the apparent wiring resistance of the respective wirings is very small as compared with the conventional one even if the current flows unevenly distributed through the respective wirings due to the "skin effect". As a result, the operating speed of the device is hardly reduced, which means that the operating speed is higher than that of the conventional one.

The effect of the present invention appeared distinctly when the frequency is 80 GHz or more, however, appeared remarkably when 100 GHz or more.

Preferable thicknesses of the conductor films are as follows:

The skin depth $\delta$ is defined as the depth in which an electric current value I is equal to that of (1/e) times as large as an electric current value Is flowing in the surface area of the wiring, where e is the base of the natural logarithm, preferably, the thickness of the respective gold films 107 and 117 is set nearly equal to twice as large as that of the value of $\delta$.

For example, in case that the entirety of the respective wirings is composed of gold, relative permeability of insulator films surrounding the wirings is 1 and frequency f of the electric current is 100 GHz, the skin depth $\delta$ is expressed by the following equation, $$\delta = (2/\omega\sigma\nu)^{1/8} = 0.24 \ [\mu m]$$

where $\omega(=2\pi f)$ is an angular frequency, $\sigma$ is conductivity of the conductor or gold, and $\mu$ is permeability of surrounding insulator films.

Therefore, in the embodiment, the thickness of the respective gold films 107 and 117 is preferably set about 0.5 μm.

Thus, if the thickness of the conductor is about (½)$\delta$ or in the range from 1.9 to 2.1 times as large as $\delta$, the electric current density at the central area in which the depth is half the thickness of the conductor can be maintained about 70%, so that an electric current density of the conductor, or the gold film 107 or 117, is almost evenly distributed. As a result, apparent increase of wiring resistance can be prevented.

If the thickness of the respective gold films 107 and 117 is lower than 1.9$\delta$, the cross section thereof is reduced and the resistance becomes very large. If the thickness is more than 2.1$\delta$, the electric current density at the central area is partially reduced to less than 70%, so that apparent wiring resistance is increased.

As a result, high-speed operation of the device cannot be obtained either way.

Preferably, the total thickness of the titanium/tungsten alloy film 105aa, the platinum film 115aa and the gold films 125aa and 107, and the total thickness of the titanium/tungsten alloy film 105b and the gold films 125b are also set about 2$\delta$, or in the range from 1.9$\delta$ to 2.1$\delta$, respectively.

Preferably, the thickness of the titanium/tungsten alloy film 105aa is set in the range from 0.04 to 0.06 μm, the thickness of the platinum film 115aa is set in the range from 0.08 to 0.12 μm, and the thicknesses of the gold films 125a and 125b are both set in the range from 0.32 to 0.38 μm.

In the embodiment, the first and second wirings are provided, however, a third wiring may be provided on the second wiring. In the case, in the same way as shown above, a fourth interlayer insulator film having an opening and a through hole is formed on the third interlayer insulator film, and the third wiring is disposed in the opening. In case of fourth or more wirings layers being provided, the same processes are repeated.

[Second Embodiment]

FIGS. 4A to 4E show a semiconductor device of a second embodiment of the present invention. The second embodiment has the same structure as that of the first embodiment except that one interlayer insulator film 326 is provided for disposing first wirings therein and for interconnecting the first and second wirings, and configurations or cross sections of the titanium/tungsten alloy film 305ab, a platinum film 315ab and the gold films 325ab and 307ab are different from those of the first embodiment.

Figure 4A:
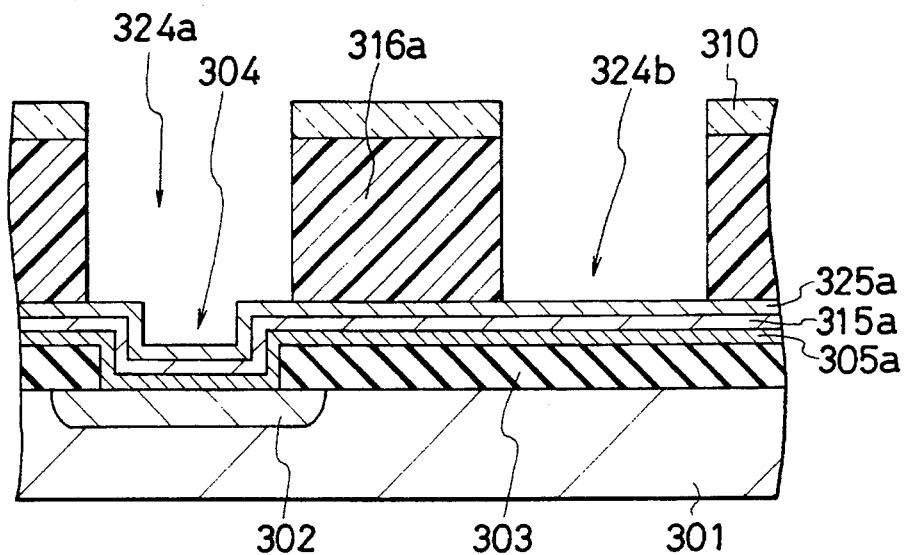
FIGS. 4A to 4E are partial cross sections respectively showing fabrication processes of the semiconductor device of a second embodiment of the present invention.
Figure 4B:
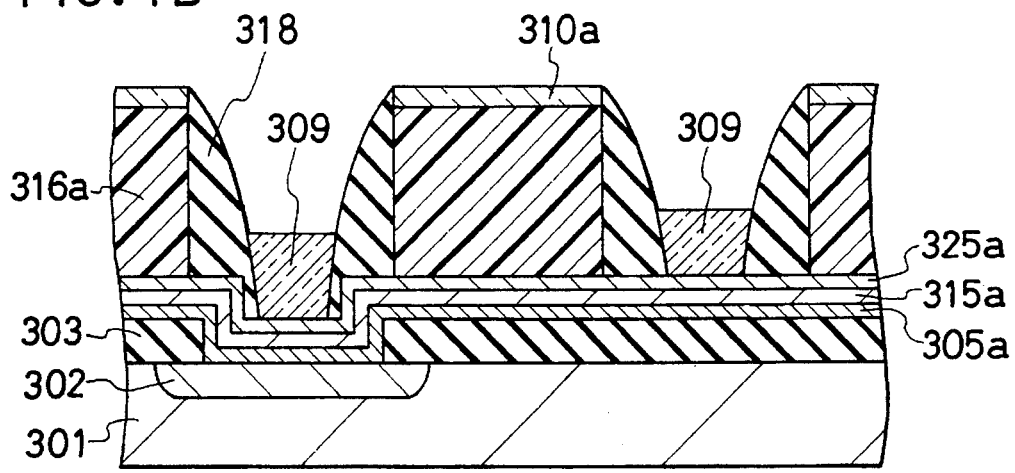
Figure 4C:
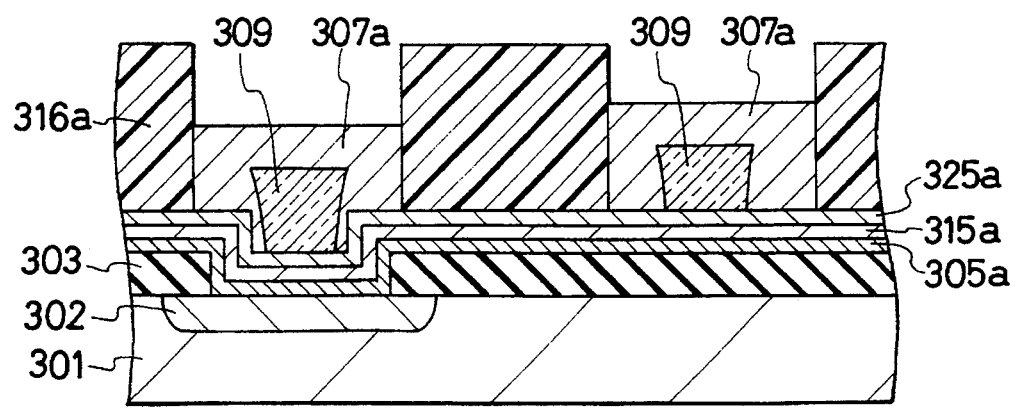
Figure 4D:
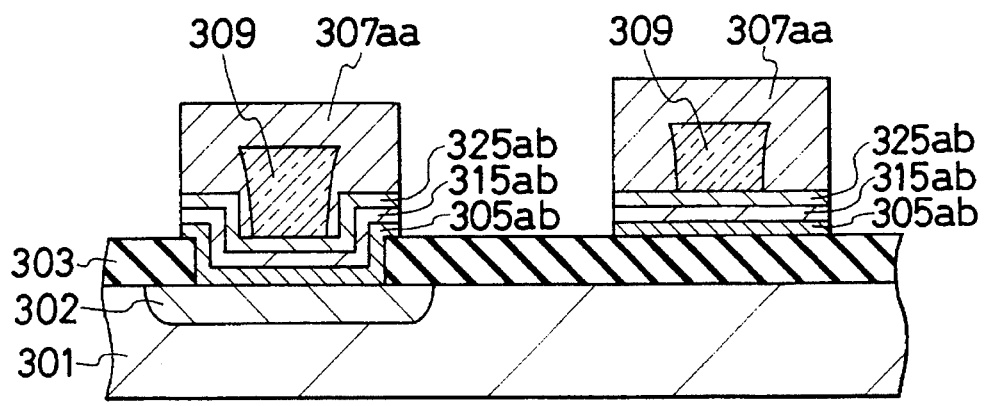
Figure 4E:
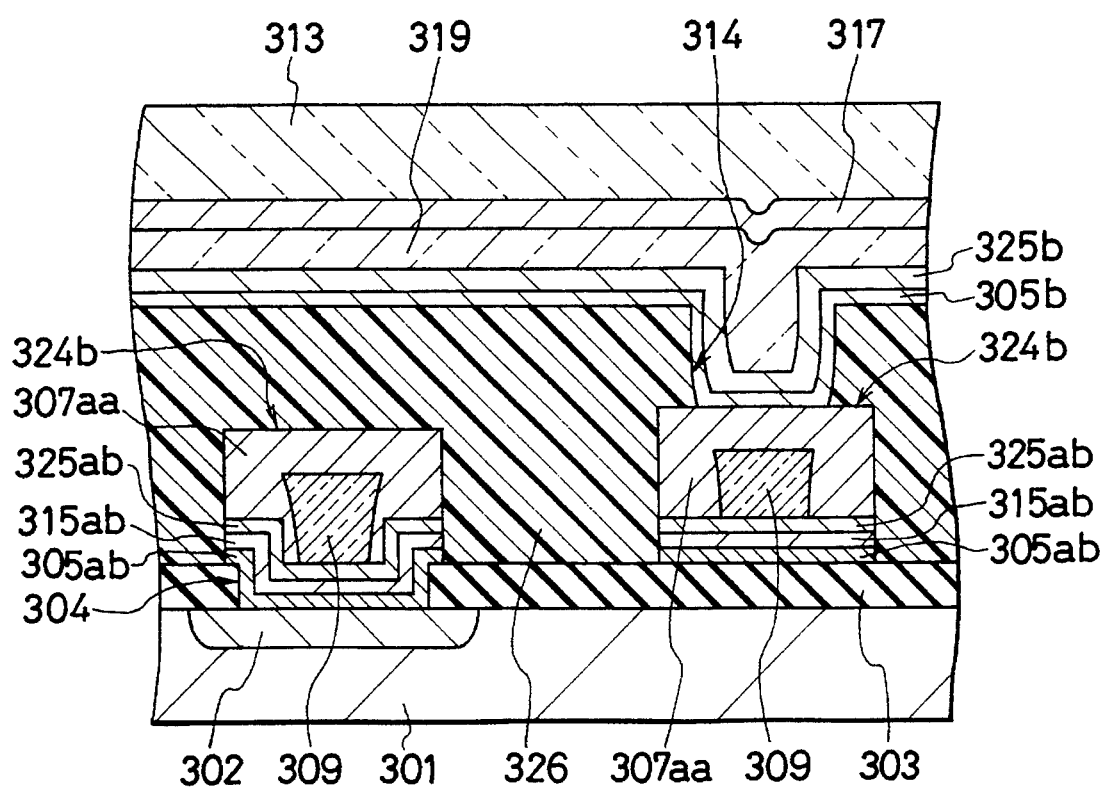

In FIG. 4E, on a surface of a P-silicon substrate 301 having a P$^+$-diffusion layer 302 therein, an insulator film 303 made of silicon dioxide is formed. The insulator film 303 has a contact hole 304 formed at a position corresponding to the diffusion layer 302. There is provided on the insulator film 303 with a first interlayer insulator film 326a made of silicon dioxide, which has first openings 324a and 324b and a through hole 314. The through hole 314 is communicated with the first openings 324b.

In the first openings 324a and 324b, the first wirings are arranged respectively. Each of the first wirings is composed of an insulator 309 of a polyimide film as a core thereof and a conductor made of four electroconductive films stacked as a clad thereof. The electroconductive films are a titanium/tungsten alloy film 305ab, a platinum film 315ab, and gold films 325ab and 307aa. The gold film 307 acts as a main component of each first wiring.

The titanium/tungsten alloy film 305ab, platinum film 315ab and gold film 325ab have cross sections bent like steps reflecting the underlying structure thereof in the first openings 324a and have linear or not-bent cross sections in the first openings 324b. The gold film 307 has a cross section bent like an inverse U character and the insulator 109 has a cross section like a rectangle in the first openings 324a and 324b.

The bottom of the insulator 309 is contacted with the gold film 325ab and the remainder thereof is contacted with the gold film 307aa. Thus, the entirety of the insulator 309 are surrounded by the gold films 307aa and 325ab.

In the first opening 324a, the titanium/tungsten alloy film 305ab is contacted with the side face of the insulator film 303 and the surface of the N$^+$-diffusion layer 302 in the contact hole 304, and is contacted with the surface of the insulator film 303. The side ends of the titanium/tungsten alloy film 305ab, the platinum film 315ab and the gold film 325ab are contacted with the side face of the first interlayer insulator film 326. The top and side faces of the titanium/tungsten alloy film 307aa are contacted with the side and inner top faces of the insulator film 303.

In the first opening 324b, the bottom face of the titanium/tungsten alloy film 305ab is contacted with the surface of the insulator film 303. The side ends of the titanium/tungsten alloy film 305ab, the platinum film 115ab and the gold film 325ab are contacted with the side face of the first interlayer insulator film 325. The top face of the gold film 307aa is contacted in its central portion with the titanium/tungsten alloy film 305b constituting the second wiring and the remainder of the top face and the side face are contacted with the first interlayer insulator film 326. Thus, the entirety of the insulators 309 are respectively surrounded by the gold films 307aa and 325ab.

On the first interlayer insulator film 326, there is provided with a second interlayer insulator film made of silicon dioxide having a second opening. In the second opening, the second wiring is arranged, each of which is composed of an insulator 319 of a polyimide film as a core thereof and a conductor made of three electroconductive films stacked as a clad thereof. The electroconductive films are a titanium/tungsten alloy film 305b and gold films 325b and 317. The gold film 317 acts as a main component of the second wiring. The second wiring has the same cross section as that of the first wiring in the first opening 324b except for not having a platinum film.

The titanium/tungsten alloy film 305b is contacted with the side face of the first interlayer insulator film 326 and the top face of the gold film 307aa of the first wiring in the through hole 314, and is contacted with a top face of a first interlayer insulator film 326 in the second opening.

There is provided with an insulator film 313 for passivation on the second interlayer insulator film. The top faces of the gold films 317 are contacted with the passivation film 313. The gold film 325b and the titanium/tungsten alloy film 305b are not contacted with the passivation film 313.

Next, the fabrication method of the semiconductor device of the second embodiment is described below referring to FIGS. 4A to 4E.

First, after selectively forming the N$^+$-diffusion layer 302 in the surface area in the P-silicon substrate 301, a silicon dioxide film as the insulator film 303 is formed on the surface of the substrate 301 by the CVD or Plasma-Enhanced CVD technique. Then, the contact hole 304 is formed in the insulator film 303.

Next, the titanium/tungsten alloy film 305a having an about 100 nm thickness, the platinum film 315a having an about 60 nm thickness and the gold film 325a having an about 200 nm thickness are successively formed on the entire surface of the substrate 301 shown in FIG. 4A, by the sputtering technique. Liquid polyimide is applied on the gold film 325a by the spin coating method and is heat-treated to form the polyimide film 316a.

A silicon dioxide film is formed on the entire surface of the polyimide film 316a by the Plasma-Enhanced CVD technique and then, the silicon dioxide film 310 and the polyimide film 316a are selectively removed to form the first openings 324a and 324b by the photolithography and dry etching techniques. The state of the device at this time is shown in FIG. 4A.

Next, on the entire surface of the substrate shown in FIG. 4A, a silicon dioxide film is formed by the Plasma-Enhanced CVD technique again and then, the silicon dioxide film is etched back by the RIE technique to form side wall spacers 318 made of the silicon dioxide film in the openings 324a and 324b respectively, as shown in FIG. 4B. At this time, the silicon dioxide film 310 is reduced in thickness to be changed to a silicon dioxide film 310a. Then, the insulators 309 made of polyimide are respectively formed in the sidewall spacers 318 by the same way as that in the first embodiment. The top face of the respective insulators 309 is lower than that of the polyimide film 316a.

Subsequently, the silicon dioxide film 318 and 310a are selectively removed and then, using the polyimide film 316a as a mask, gold films 307a are formed in the openings 324a and 324b respectively, as shown in FIG. 4C, by the electric plating technique in which the gold film 325a is used as an electrode for the plating. Thus, the insulator 309 is surrounded by the gold film 307a. At the time, the top face of the old film 307a is lower than that of the polyimide film 316a.

The polyimide film 316a is selectively removed as shown in FIG. 4D. In the process, since the insulator 309 made of polyimide is surrounded by the gold films 307 and 325a, it is not removed.

The gold film 325a, the platinum film 315a and the titanium/tungsten alloy film 305a are etched back to be removed till the insulator film 303 is exposed by the ion milling technique and then, the films 325ab, 315ab and 305ab are formed. In the process, the gold film 307a is reduced in thickness to be changed to the gold film 307aa. Thus, the processes of forming the first wirings are finished.

Next, as shown in FIG. 4E, a silicon dioxide film having a flat surface and a thickness larger than that of the first wirings is formed as the first interlayer insulator film 326.

Then, in the same way as that of the first embodiment, the processes such as forming the through hole 314 in the first interlayer insulator film 326, forming the second interlayer insulator film having a second opening for a second wiring, the titanium/tungsten alloy film 305b, forming the golf film 325b and 317 and the insulator 319, and forming the passivation layer 313 are performed. Thus, the semiconductor device of the second embodiment is obtained.

In the second embodiment, the same effect can also be obtained as in the first embodiment, however, since the first interlayer insulator film 326 is made of a silicon dioxide film, not a silicon nitride film, parasitic capacitance is smaller than that of the first embodiment, which means more preferable to the first embodiment in the high-frequency operation.

The effect of the present invention appeared distinctly when the frequency is 80 GHz or more, however, appeared remarkably when 100 GHz or more.

What is claimed is:

1. A semiconductor device with a wiring, said wiring comprising an insulator, and a conductor formed so as to surround said insulator;

said conductor being composed of a plurality of electroconductive layers, with an innermost electroconductive layer of said plurality of electroconductive layers being made of gold.

2. The semiconductor device according to claim 1, wherein an outermost electroconductive layer of said plurality of electroconductive layers is made of metal containing titanium.

3. The semiconductor device according to claim 2, wherein said plurality of electroconductive layers includes a platinum layer.

4. The semiconductor device according to claim 3, wherein said insulator is made of polyimide.

5. The semiconductor device according to claim 4, wherein each of said electroconductive layers comprises a first part and a second part, said first part being made of electroconductive layers and said second part being made of one electroconductive layer.

6. The semiconductor device according to claim 5, wherein said first part has a cross section bent like a U character, and said second part is buried in said inner space formed inside of said first part.

7. The semiconductor device according to claim 5, wherein said first part has a substantially linear cross section, and said second part is disposed on said first part surrounding said insulator.

* * * * *